United States Patent [19] [11] Patent Number: 4,998,105
Takekoshi et al. [45] Date of Patent: Mar. 5, 1991

[54] ABSOLUTE POSITION ENCODER

[75] Inventors: Yoshitaka Takekoshi, Hachioji; Mitsuyuki Taniguchi, Yamanashi, both of Japan

[73] Assignee: Fanuc Ltd., Yamanashi, Japan

[21] Appl. No.: 336,351

[22] PCT Filed: Jun. 15, 1988

[86] PCT No.: PCT/JP88/00578
§ 371 Date: Jan. 19, 1989
§ 102(e) Date: Jan. 19, 1989

[87] PCT Pub. No.: WO88/10409
PCT Pub. Date: Dec. 29, 1988

[30] Foreign Application Priority Data

Jun. 15, 1987 [JP] Japan .................. 62-146922

[51] Int. Cl.$^5$ ............................. H03M 1/22
[52] U.S. Cl. .......................... 341/13; 341/9; 341/15; 250/231.16; 324/208; 324/207.25
[58] Field of Search ............ 341/9, 13, 15, 17; 250/231 SE; 318/652; 324/208, 252

[56] References Cited

U.S. PATENT DOCUMENTS 4,346,447  8/1982  Takahama .............. 250/231 SE
4,360,730 11/1982  Breslow ...................... 341/13
4,445,110  4/1984  Breslow ...................... 341/13
4,524,347  6/1985  Rogers ....................... 341/13
4,587,513  5/1986  Burrowes et al. ............. 341/13
4,774,464  9/1988  Kubota et al. ................. 341/9
4,786,891 11/1988  Ueda et al. .................. 341/13

FOREIGN PATENT DOCUMENTS 55-18985  7/1978  Japan.
56-13821  3/1981  Japan.

Primary Examiner—William M. Shoop, Jr.
Assistant Examiner—Sharon D. Logan
Attorney, Agent, or Firm—Armstrong, Nikaido, Marmelstein, Kubovcik & Murray

[57] ABSTRACT

An absolute position encoder comprising a rotary code plate for obtaining sine wave outputs of a plurality of channels each having a different number of cycles per revolution, A/D converters for respectively A/D-converting the sine wave outputs of the plurality of channels for constituting rotational angular data of the code plate, and a ROM for storing at corresponding addresses interpolated data obtained by interpolation of angular data of one wavelength of the channels into a predetermined number of divisions sequentially using outputs of the A/D converters corresponding to the channels as address data, and for storing at corresponding addresses corrected data obtained by correction of an interpolation error included in interpolated data of upper channels having small numbers of cycles based on correction address data using interpolated data of lower channels having large numbers of cycles as the correction address data, wherein an absolute position of a moving body is detected by synthesis of the interpolated data readout in accordance with address data of a lowest channel having a largest number of cycles and the corrected data of the upper channels higher than the lowest channel, the corrected data being read out on the basis of the correction address data.

2 Claims, 4 Drawing Sheets

ABSOLUTE POSITION ENCODER

TECHNICAL FIELD

The present invention relates to an absolute position encoder and, more particularly, to an absolute position encoder capable of detecting a rotational position or the like of a rotating shaft of a motor or the like for driving a machine tool or the like to an absolute position.

BACKGROUND ART

An absolute position encoder of this type is generally arranged as follows. A plurality of channels (slit array) formed on a rotary code plate fixed on a rotating shaft on the basis of a binary code notation or a Gray code notation are arranged in accordance with a desired resolving power. An amount of light emitted from a light-emitting element and passing through each channel formed on the rotary code plate and a fixed slit portion opposing each channel is detected by a light-receiving element (photoelectric conversion element) so that a rotational position of the rotary code plate is detected as an absolute position.

In this case, to improve the detecting precision (resolving power), the number of channels must be increased. For example, to detect angular data obtained by dividing one revolution into 4096, i.e., $2^{12}$, 12 channels are required (a 12-bit code is required), and a large code plate is required in correspondence with the number of channels.

To solve the above problems, the following method has been considered. Sine wave patterns for the plurality of channels are arranged on the rotary code plate so that a plurality of sine wave outputs having different numbers of cycles per revolution can be obtained (for example, a pattern for obtaining a sine wave output having one cycle per revolution serves as a first channel, a pattern for obtaining a sine wave output having 16 cycles per revolution serves as a second channel, and a pattern for obtaining a sine wave output having 256 cycles per revolution serves as a third channel). Angular data of one wavelength of each channel is interpolated into 16 pieces. Interpolated data of the channels thus obtained are sequentially synthesized, so that the rotational position of the code plate is detected as the absolute position.

In this case, the number of channels for obtaining identical resolving powers may be small compared with the number of channels formed according to the above-mentioned binary notation (for example, to detect the absolute position by dividing one revolution into $2^{12}$, only three channels as described above are required), thereby realizing a small-size rotary code plate.

FIG. 1 illustrates an absolute position encoder for detecting angular data using a rotary code plate in which sine wave patterns of a plurality of channels having different numbers of cycles are formed. In FIG. 1, first to third channels (represented by 1λ, 16λ, and 256λ) are formed on the rotary code plate. In addition, a fourth channel (a pattern for obtaining a sine wave output having 4096 cycles per revolution is arranged and represented by 4096λ) is arranged. Sine wave signals 1λsin, 16λsin, 256λsin, and 4096λsin, and cosine wave signals each having an electrical phase difference of 90° with respect to the corresponding sine wave signal (e.g., the cosine wave signals can be obtained by detecting by a light-receiving element and photoelectrically converting light passing through a fixed slit portion shifted from a fixed slit portion for the sine wave signals by an electrical angle of 90°) 1λcos, 16λcos, 256λcos, and 4096λcos are input from each of the channels.

Reference numerals 11 to 14 denote amplifiers for respectively amplifying the sine wave signals 1λsin to 4096λsin; 21 to 24, channel selection analog switches respectively connected to output sides of the amplifiers 11 to 14; 16 to 19, amplifiers for respectively amplifying the cosine wave signals 1λcos to 4096λcos; 26 to 29, channel selection analog switches respectively connected to output sides of the amplifiers 16 to 19.

When the angular data of the rotary code plate is detected, first switches 21 and 26 are turned on, and therefore, sine and cosine wave signals 4096λsin and 4096λcos from a signal detector (corresponding light-receiving elements) are amplified by the corresponding amplifiers 11 and 16. Thereafter, these amplified signals pass through the switches 21 and 26, and are converted into digital data each having a predetermined bit by A/D converters 31 and 32, in accordance with a required resolving power. The digital data (so-called sin data Xs and cos data Xc) obtained by the A/D converters 31 and 32 are supplied to a ROM 4 as their address inputs (e.g., row and column address inputs). A product obtained by multiplying arctan Xs/Xc by an appropriate constant is converted into a binary number and stored in the ROM 4, in accordance with designated addresses (the addresses are designated by the sin and cos data Xs and Xc).

More specifically, for example, when a sine wave signal 4096λsin input at this time is 0.5 V, and a cosine wave signal 4096λcos is also 0.5 V, these signals are converted into the predetermined digital amount, e.g., "0100", by A/D converters 31 and 32 (i.e., sin and cos data Xs and Xc to be input to the ROM 4 are set to be "0100"). Therefore, when such sin and cos data are input as address signals, the ROM data stored at the corresponding addresses can be obtained as follows. That is, a product obtained by multiplying $(\tan^{-1}1 = 45°)$ with a constant 1/360, i.e., ⅛, is converted into an appropriate binary number to obtain, e.g., "00100000". Among such 8-bit stored data, e.g., the upper 4 bits, i.e., "0010", are read and latched into a latch circuit 51. In this case, angular data of one wavelength of the corresponding channel (i.e., 4096λ) is latched as interpolated data obtained by dividing the angular data into 16 pieces.

Then, the channel selection switches 21 and 26 are switched to the switches 22 and 27. Sine and cosine wave signals 256λsin and 256λcos input at this time are similarly converted into digital data by the A/D converters 31 and 32. The sin and cos data thus obtained are input again as address signals of the ROM 4 and the ROM data corresponding to the addresses are read as in the above case, thus latching the read data (4-bit data in this case) into a latch circuit 52.

Similarly, the channel selection switches are sequentially switched to the switches 23 and 28, and to the switches 24 and 29. The sin and cos data obtained by A/D conversion of signals 16λsin, 16λcos, 1λsin, and 1λcos input at corresponding times are input as address signals of the ROM 4. Then, the ROM data corresponding to the addresses are read out and the read data are sequentially latched into latch circuits 53 and 54.

As described above, the channels (4 channels in this case) are sequentially switched, the ROM data read by supplying two-phase input signals of the channels as predetermined address data are sequentially latched into the latch circuits, and the data of the latch circuits are synthesized. For example, the angular data of the rotary code plate can be detected in accordance with 16-bit data from the data latched by the latch circuit 54 (upper bit data) to the data latched by the latch circuit 51 (lower bit data). In this case, the absolute position thereof can be detected by setting the number of divisions per revolution to $2^{16}$ (i.e., by setting the resolving power per revolution to $\frac{1}{2}^{16}$).

The sine and cosine wave input signals generated by the above-mentioned channels do not always have accurate waveforms. Since the waves contain harmonics, an interpolation error occurs. In addition, an amplitude difference or phase shift (shift from phase difference of 90°) actually generated between the sine and cosine input signals corresponding to the channels causes the interpolation error. When such an interpolation error exceeds a predetermined value, a fatal detection error of the angular data undesirably occurs.

DISCLOSURE OF THE INVENTION

The present invention has been made to solve the above problems, and an absolute position encoder is provided, which encoder comprises a rotary code plate for obtaining sine wave outputs of a plurality of channels each having the different number of cycles per revolution, A/D converters for respectively A/D-converting the sine wave outputs of the plurality of channels for constituting rotational angular data of the code plate, and a ROM for storing at corresponding addresses interpolated data obtained by interpolation of angular data of one wavelength of the channels into the predetermined number of divisions sequentially using outputs of the A/D converters corresponding to the channels as address data, and for storing at corresponding addresses corrected data obtained by correction of an interpolation error included in interpolated data of upper channels having small numbers of cycles based on correction address data using interpolated data of lower channels having large numbers of cycles as the correction address data, wherein an absolute position of a moving body is detected by synthesis of the interpolated data readout in accordance with address data of a lowest channel having a largest number of cycles and the corrected data of the upper channels higher than the lowest channel, the corrected data being read out on the basis of the correction address data.

With the above arrangement, interpolation errors included in the interpolated data of the upper channels are sequentially corrected in accordance with the interpolated data of the lower channels. Thus, by correcting the interpolation error due to amplitude difference or phase shift between two-phase input signals consisting of sine and cosine waves, an incorrect detected data output can be prevented.

BEST MODE FOR CARRYING OUT THE INVENTION

Figure 1:
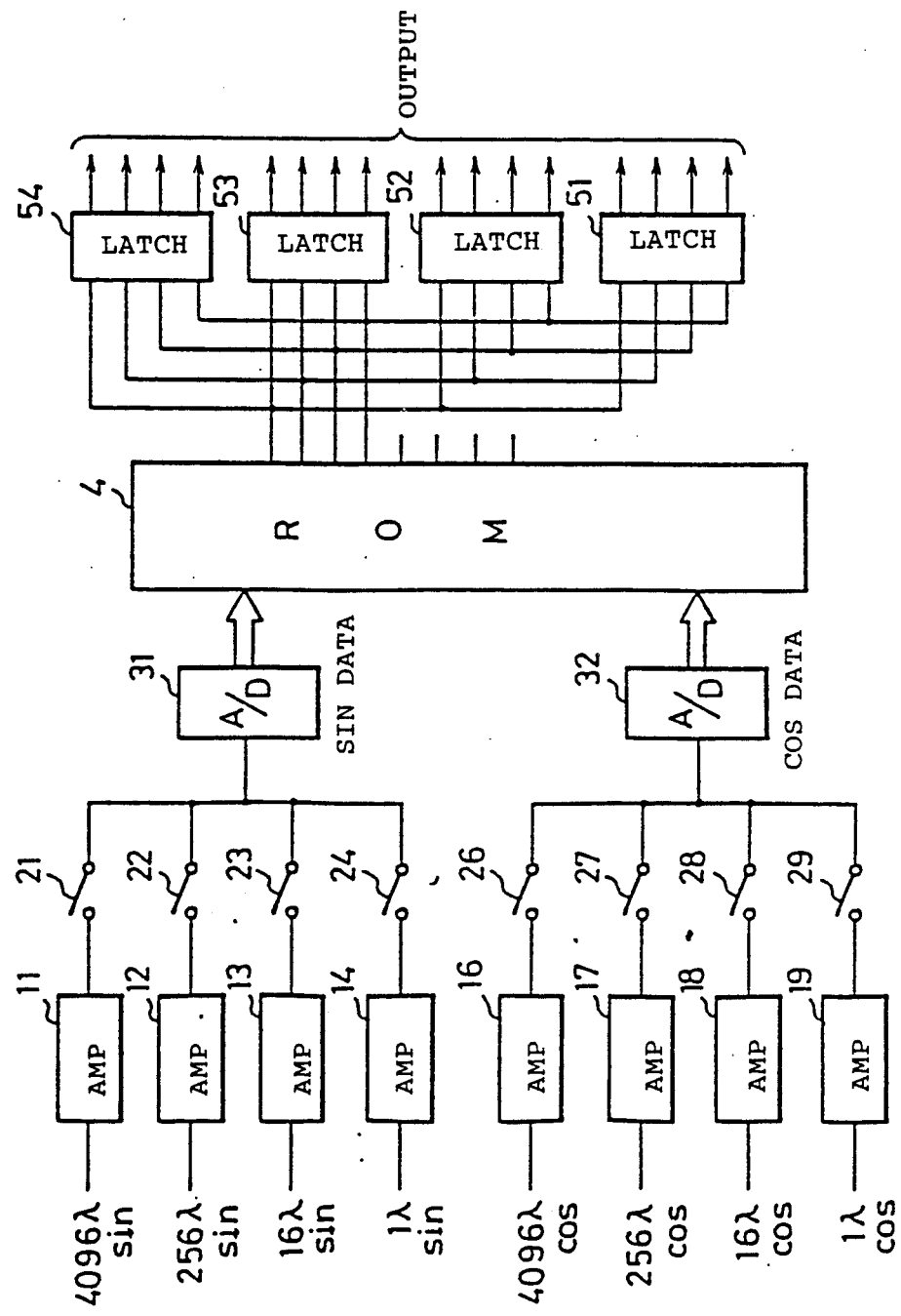
FIG. 1 is a circuit diagram showing an arrangement of an absolute position encoder according to a prior art.
Figure 2:
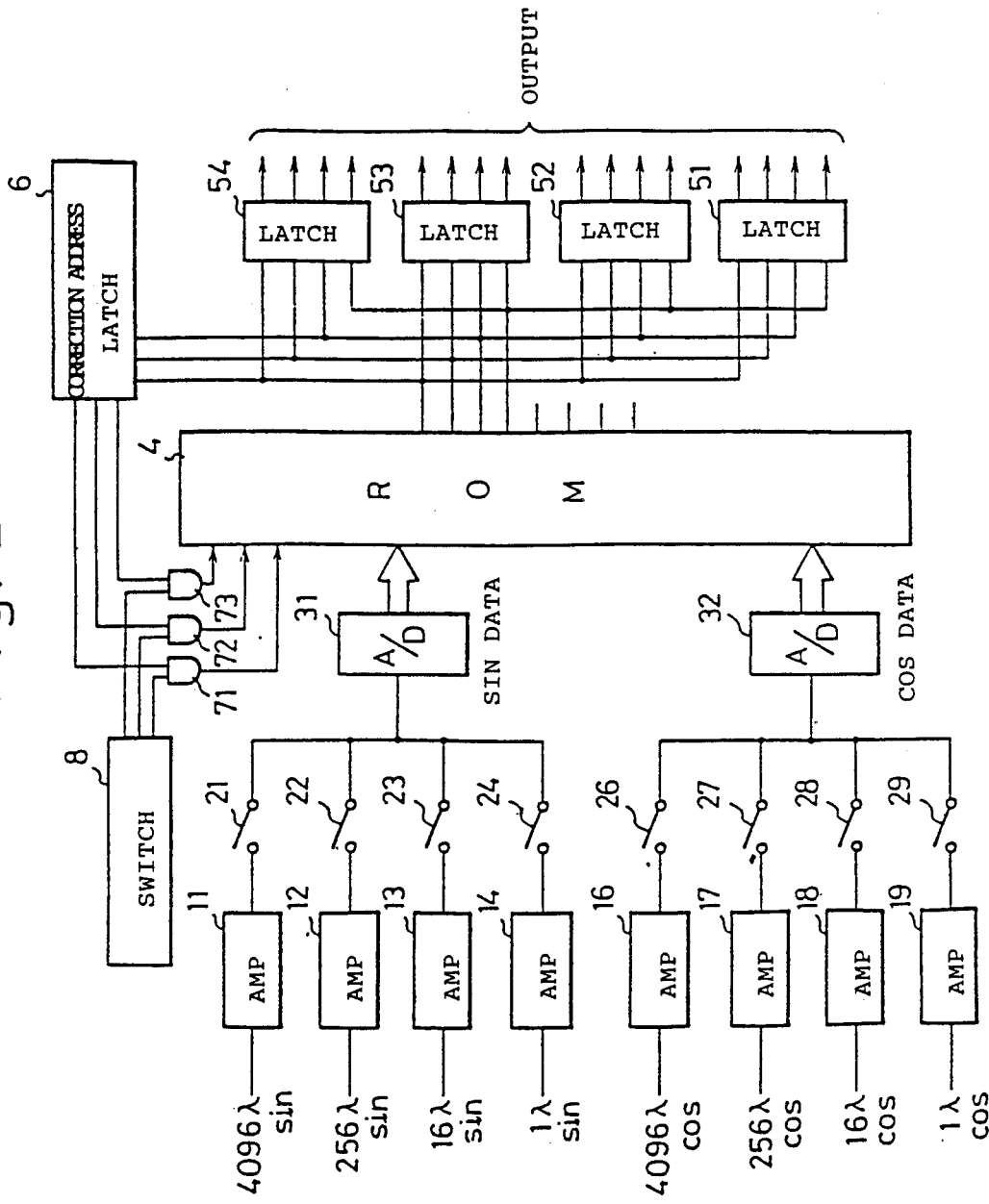
FIG. 2 is a circuit diagram showing an arrangement of the absolute position encoder according to an embodiment of the present invention.

FIG. 2 is a circuit diagram showing an absolute position encoder according to an embodiment of the present invention. Using a rotary code plate in which sine wave patterns of a plurality of channels (4 channels in this case) each having a different number of cycles are formed, two-phase signals of the 4 channels, 4096λsin and 4096λcos; 256λsin and 256λcos; 16λsin and 16λcos; and 1λsin and 1λcos are generated and these signals are supplied as input signals for absolute position detection, in the same manner as in FIG. 1 as described above.

The difference between the circuit shown in FIG. 2 and the conventional circuit shown in FIG. 1 is as follows. In the circuit in FIG. 2, to read from a ROM 4 corrected data obtained by correction of interpolated data of upper channels using interpolated data of lower channels, the interpolated data of the lower channels are input to the ROM 4 as correction address data.

More specifically, in FIG. 2, reference numeral 6 denotes a latch circuit for latching the correction address data. The latch circuit sequentially latches the interpolated data corresponding to the channels read from the ROM 4. Note that in the embodiment shown in FIG. 2, only upper 3 bits in 4-bit interpolated data read out from the ROM 4 (sequentially read out from the lowest channel side) are sequentially latched into the latch circuit 6. The data latched into the latch circuit 6 (3-bit data in this case) are respectively input as input signals of one input of each of AND gates 71 to 73. An output signal from a switch 8 is input to the other input of each of the AND gates 71 to 73. The switch 8 outputs the signals for controlling the AND gates 71 to 73 so that the AND gates 71 to 73 are disabled while two-phase input signals 4096λsin and 4096λcos corresponding to the lowest channel are input, and that the AND gates 71 to 73 are enabled after two-phase input signals 256λsin and 256λcos corresponding to the next channel are input.

An operation for detecting final angular data using the circuit shown in FIG. 2 will be described hereinafter. First, the switches 21 and 26 are turned on in the same manner as in FIG. 1 as described above. Therefore, the two-phase signals 4096λsin and 4096λcos corresponding to the lowest channel are amplified by corresponding amplifiers 11 and 16. Thereafter, the amplified signals are converted into digital data each having a predetermined bit by A/D converters 31 and 32. The digital data (sin and cos data) obtained by these A/D converters 31 and 32 are input to the ROM 4 as its address data, and thus the data stored at the designated addresses are read out from the ROM 4. In this case, in accordance with the input sin and cos data Xs and Xc, a value corresponding to, e.g., $(1/360 \times \tan^{-1} Xs/Xc)$ is stored at the designated addresses of the ROM 4 as a predetermined binary value, as described above.

The data thus read out from the ROM 4 corresponding to the lowest channel (4-bit data is read in this case) is latched by a latch circuit 51 and the correction address latch circuit 6. Note that in the embodiment in FIG. 2, although only upper 3-bit data in 4-bit data to be latched by the latch circuit 51 is latched by the latch circuit 6, all the 4-bit data to be latched by the latch circuit 51 may be latched by the latch circuit 6.

When the interpolated data corresponding to the lowest channel is read from the ROM 4 (i.e., when the two-phase signals 4096λsin and 4096λcos are input), the AND gates 71, 72, and 73 are disabled by the switch 8. As a result, the data latched by the latch circuit 6 is not input as correction address data for the ROM 4.

Then, the channel selection switches 21 and 26 are switched to switches 22 and 27. Therefore, two-phase signals 256λsin and 256λcos corresponding to the next upper channel are amplified by amplifiers 12 and 17. Thereafter, the amplified data are converted into digital data each having a predetermined bit by the A/D converters 31 and 32. The digital data obtained by these A/D converters 31 and 32 (sin and cos data) are input to the ROM 4 as its address data. At the same time, the AND gates 71 to 73 are enabled by the switch 8, and the readout data (upper 3-bit data in this case) from the ROM 4 corresponding to the lowest channel (4096λ) latched by the latch circuit 6 in advance is input to the ROM 4 as correction address data.

On the basis of these address data (sin and cos data) and the correction address data, the following correction data is stored at the corresponding addresses in the ROM 4.

More specifically, first, the product $(1/360 \times \tan^{-1} Xs/Xc)$ is calculated based on address data (sin and cos data $Xs$ and $Xc$) of the upper channel (256λ in this case), as described above. The above product is converted into a predetermined binary number to obtain interpolated data B. Simultaneously, correction address data A (binary number) corresponding to upper 3-bit data of the interpolated data of the lowest channel input to the ROM 4 from the latch circuit 6 through the AND gates 71 to 73 is divided by the number of divisions of one wavelength of each channel (generally represented by $2^n$).

In this embodiment, since the number of divisions of one wavelength of each channel is 16, i.e., $2^4$, the interpolated data of the lower channel (3-bit data in this case) is divided by $2^4$ (i.e., the data is shifted to the right by 4 bits). A difference between data B (i.e., interpolated data before correction of the upper channel) and $A/2^4$ (i.e., interpolated data of the lower channel/the number of interpolating divisions per wavelength) thus obtained, i.e., $(B-A/2^4)$ is calculated ($(B-A/2^n)$ is generally calculated). When the decimal part of the calculated data is 0.5 or more, (in this case, when the fifth bit (generally, the $(n+1)$th bit when the above-mentioned number of divisions is $2^n$) of the binary number is "1"), the integral part (the fourth bit (generally, nth bit) of the binary number in this case) of the calculated data is incremented by "1". The calculated data thus obtained (4-bit data) serves as correction data for the lower channel (256λ in this case). On the contrary, the decimal part of the calculated data is less than 0.5, (in this case, the fifth bit of the binary number is "0"), the calculated data (4-bit data) directly serves as correction data for the lower channel (256λ in this case).

The calculation results of the correction data thus obtained are summarized in Table 1. In this case, 7-bit interpolated data are stored at each address of the ROM 4 as internal processing data. The upper 4-bit data thereof is read out and latched by the latch circuits 51 to 54. In addition, only the upper 3-bit data is latched by the correction address latch circuit 6, as described above.

Only the cases wherein the above-mentioned data B is "0000000", "0000001", and "0000111" are exemplified in Table 1 as follows.

TABLE 1

| data B before correction of upper channel | lower channel 3-bit data A for correction | upper channel data after correction (4-bit data) |
|---|---|---|
| 0000100 | 101 | 1111 |
| | 110 | 1111 |
| | 111 | 1111 |
| | 000 | 0000 |
| | 001 | 0000 |
| | 010 | 0000 |
| | 011 | 0000 |
| | 000 | 0000 |
| 0000001 | 110 | 1111 |
| | 111 | 1111 |
| | 000 | 0000 |
| | 001 | 0000 |
| | 010 | 0000 |
| | 011 | 0000 |
| | 100 | 0000 |
| | 101 | 0000 |
| 0000111 | 100 | 0000 |
| | 101 | 0000 |
| | 110 | 0000 |
| | 111 | 0000 |
| | 000 | 0001 |
| | 001 | 0001 |
| | 010 | 0001 |
| | 011 | 0001 |

More specifically, for example, when the above-mentioned data B is "0000000" and the data A is "101", the data A is shifted to the right by 4 bits to obtain "0000101". Then, a calculation (0000000 (binary number)) —0000101 (binary number)) is performed to obtain "1111011" as the calculated data. As described above, upper 4-bit data thereof represents the integral part and lower bits from the fifth bit represent the decimal part. Since the fifth bit is "0" (i.e., its decimal part is less than 0.5) in the above case, the integral part "1111" directly serves as readout data after correction for the upper channel (256λ in this case).

On the other hand, for example, when the data B is "0000000" and the data A is "001", the data A is shifted to the right by 4 bits to obtain "0000001". Then, a calculation (0000000 (binary number) —0000001 (binary number)) is performed to obtain "1111111" as the calculated data. Therefore, the fifth bit is "1", and hence "0000" obtained by adding "1" to the fourth bit (round off the overflow part) is given as readout data after correction for the upper channel (256λ in this case). The readout data after the correction is latched by the latch circuit 52, and, e.g., the upper 3-bit data thereof is latched by the correction address latch circuit 6.

Then, the channel selection switches 22 and 27 are switched to the switches 23 and 28. ROM data B before correction for the next upper channel (16λ) is corrected by the 3-bit data A of the lower channel (256λ in this case) latched by the latch circuit 6 at this time in the same manner as in the above. Then, the data after the correction is latched by the latch circuit 53 and upper 3-bit data thereof is latched by the latch circuit 6.

In addition, the channel selection switches 23 and 28 are switched to the switches 24 and 29, and ROM data B before correction for the uppermost channel (1λ) is corrected by the 3-bit data A of the lower channel (16λ in this case) latched by the latch circuit 6 at this time in the same manner as in the above, thus latching the data after the correction by the latch circuit 54.

The 4-bit readout data thus latched by the latch circuits 51 to 54 are synthesized, and therefore, the absolute position of the code plate can be accurately detected at the resolving power of $\frac{1}{2^{16}}$ per revolution in accordance with a total of 16-bit data.

Figure 3:
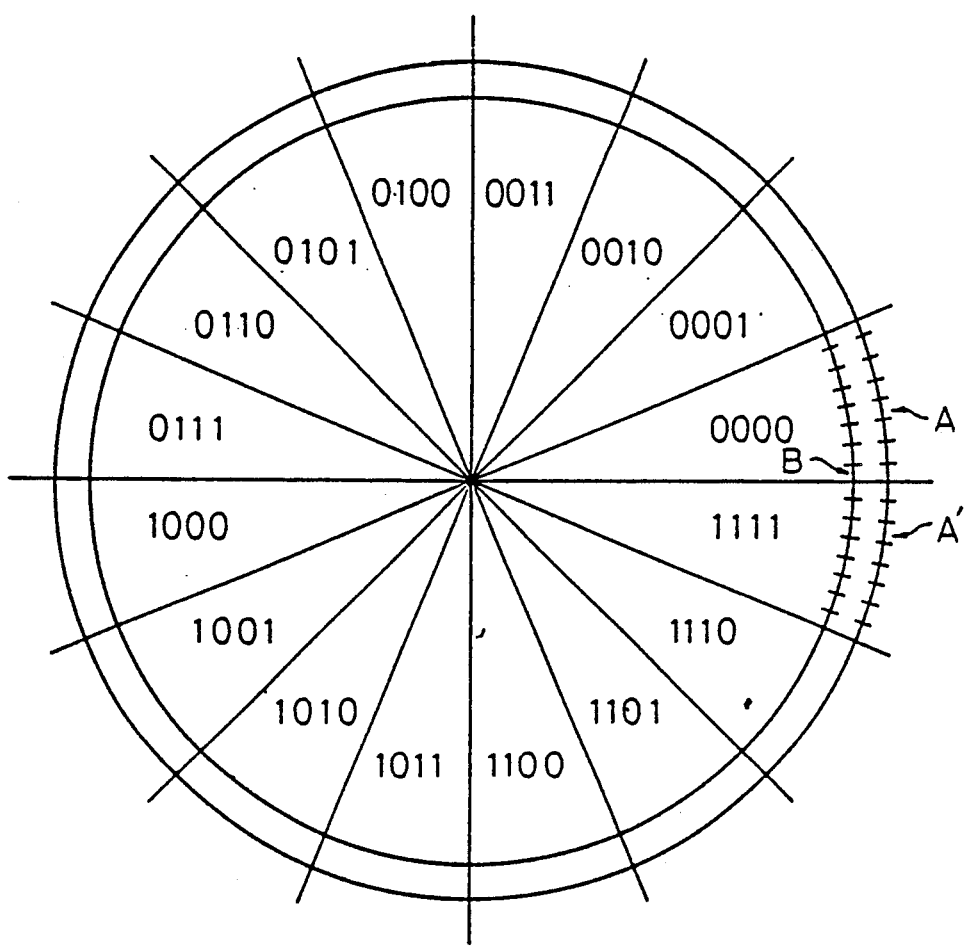
FIG. 3 is a view showing an example of an actual angle in the case when correction for an interpolation error is performed according to the present invention.

FIG. 3 shows an example of the above-mentioned correction for an interpolation error by means of an actual angle. For example, even if ROM data (so-called coarse ROM data) B read out from the upper channel is "0000000", when upper channel correction ROM data read out from the lower channel in advance (so-called fine ROM data) A is "011", the data after correction must be "0000011" (note that only upper 4-bit data "0000" is illustrated in Table 1), and on the other hand, when the fine ROM data A' is "110", the data after the correction must be "1111110" (in this case, only upper 4-bit data "1111" is illustrated in Table 1), as shown in FIG. 3.

Figure 4:
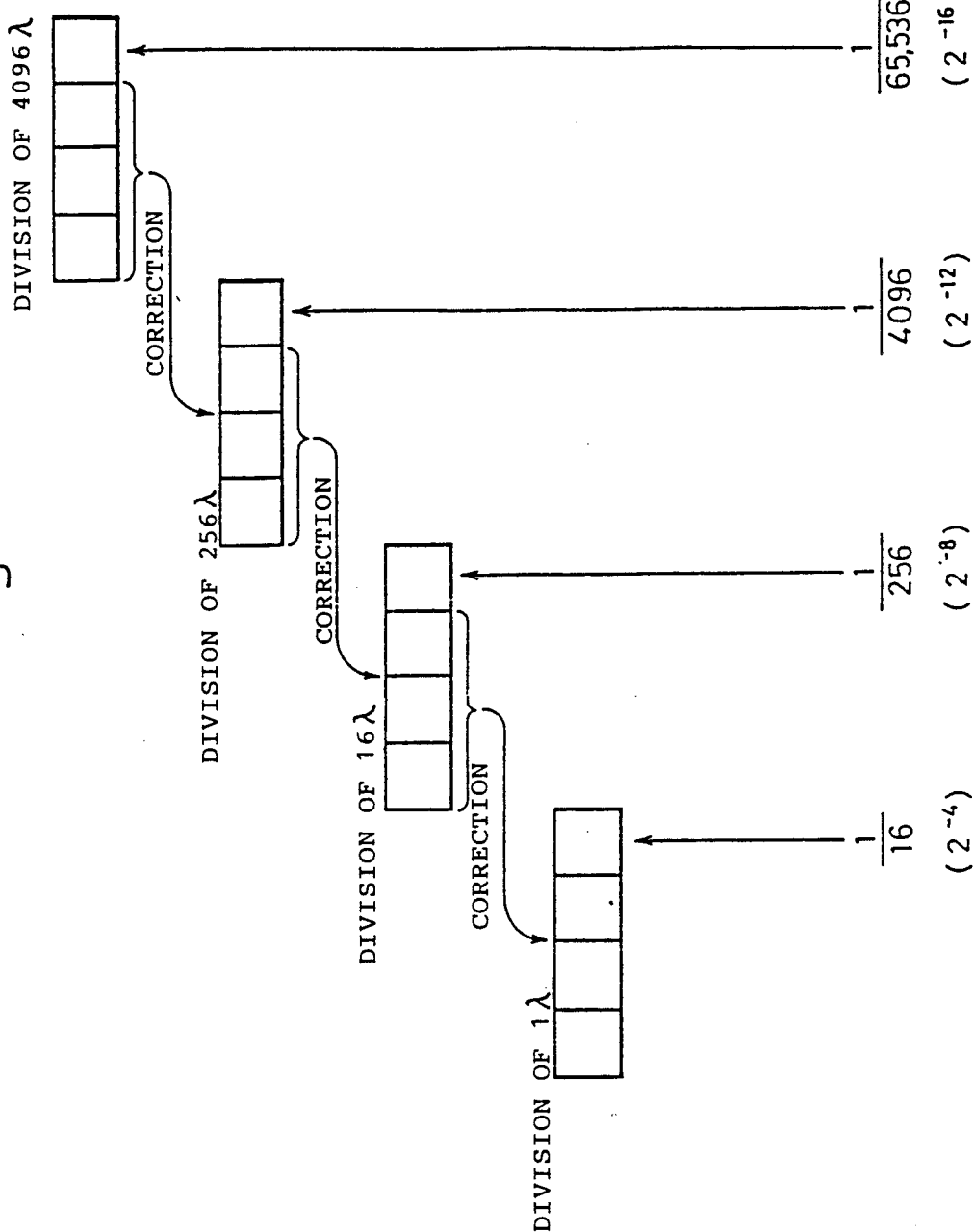
FIG. 4 is a view showing a state wherein upper channel data among data output from a circuit of FIG. 2 is corrected in accordance with lower channel data.

FIG. 4 shows each 4-bit data respectively latched by the latch circuits 51 to 54 according to the circuit in FIG. 2. As shown in FIG. 4, ROM data at the upper channel side are sequentially corrected in accordance with ROM data of its lower channel side.

More specifically, the ROM data latched by the latch circuit 51 in correspondence with the lowest channel (4096λ) is not corrected, and thus the ROM data (4-bit data in this case) obtained by conversion of the above-mentioned ($1/360 \times \tan^{-1} X_s/X_c$) into an appropriate binary number is latched by the latch circuit 51. Then, the data latched by the latch circuit 52 in correspondence with its upper channel (256λ) is corrected by the ROM data (upper 3-bit data thereof in this case) of the lower channel (4096λ), and the ROM data after the correction (4-bit data in this case) is latched by the latch circuit 52. ROM data of the upper channels (16λ and 1λ) are sequentially corrected by the respective lower channels (256λ and 16λ) in the same manner as in the above case, and the ROM data after the correction are sequentially latched by the latch circuits 53 and 54. The rotational angle of the code plate (therefore, the absolute position of a predetermined moving body) can be accurately detected with the detecting precision of $\frac{1}{2^{16}}$ per revolution in accordance with 16-bit ROM data thus latched by the latch circuits 51 to 54.

According to the present invention, even if a sine wave input signal supplied from a light-receiving element contains harmonics, or the amplitude difference or phase shift occurs to some extent between the sine wave signal and a cosine wave signal, by eliminating the interpolation error due to the above problems, the absolute position of a moving body can be accurately detected with predetermined detecting precision.

We claim:
1. An absolute position encoder comprising:
a rotary code plate for obtaining sine wave outputs of a plurality of channels each having a different number of cycles per revolution;
A/D converters for respectively A/D-converting the sine wave outputs of said plurality of channels for constituting rotational angular data of said rotary code plate; and
a ROM storing, at corresponding addresses, an interpolation data obtained by interpolation of angular data of one wavelength of said channels into a predetermined number of divisions sequentially using outputs of said A/D converters corresponding to said channels as address data, and said ROM storing, at corresponding addresses, corrected data obtained by correction of an interpolation error included in an upper channel interpolation data having small numbers of cycles based on correction address data using a lower channel interpolation data having large numbers of cycles as the correction address data,
wherein an absolute position of a moving body is detected by synthesis of the interpolation data read out in accordance with address data of a lowest channel having a largest number of cycles and the corrected data of the upper channels higher than said lowest channel, said corrected data being read out on the basis of said correction address data.

2. An absolute position encoder according to claim 1, wherein the lower channel interpolation data is converted into a binary number to obtain data A, the upper channel interpolation data is converted into a binary number to obtain data B, $(B - A/2^n)$ is calculated by the binary numbers using the number of divisions $2^n$ (n is an integer) of each of said channels, "1" is added to the nth bit of the calculated data when an (n+1)th bit of the calculated data is "1", and the n-bit calculated data thus added and corrected serves as corrected data of said upper channel, while the n-bit calculated data directly serves as corrected data of the upper channel when said (n+1)th bit of the calculated data is "0".

* * * * *